United States Patent
Yokoyama et al.

(10) Patent No.: US 11,658,077 B2
(45) Date of Patent: May 23, 2023

(54) METHOD FOR MANUFACTURING SEMICONDUCTOR MEMBER AND METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Noboru Yokoyama, Hakusan Ishikawa (JP); Kazuyuki Sato, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 256 days.

(21) Appl. No.: 17/201,488

(22) Filed: Mar. 15, 2021

(65) Prior Publication Data

US 2022/0093475 A1 Mar. 24, 2022

(30) Foreign Application Priority Data

Sep. 18, 2020 (JP) .............................. JP2020-157540

(51) Int. Cl.
*H01L 21/66* (2006.01)
*H01L 29/66* (2006.01)
*H01L 21/02* (2006.01)
*H01L 21/308* (2006.01)

(52) U.S. Cl.
CPC .......... *H01L 22/12* (2013.01); *H01L 21/0254* (2013.01); *H01L 21/02529* (2013.01); *H01L 21/02532* (2013.01); *H01L 21/308* (2013.01); *H01L 29/66734* (2013.01)

(58) Field of Classification Search
CPC ............... H01L 22/12; H01L 21/02529; H01L 21/02532; H01L 21/0254; H01L 21/308; H01L 29/66734
See application file for complete search history.

(56) References Cited

U.S. PATENT DOCUMENTS

| 7,642,178 B2 | 1/2010 | Yamauchi et al. |
| 8,364,302 B2 | 1/2013 | Kiermasz |
| 2016/0336396 A1 | 11/2016 | Konrath et al. |

FOREIGN PATENT DOCUMENTS

| JP | 5150048 B2 | 2/2013 |
| JP | 5490721 B2 | 5/2014 |
| JP | 5702622 B2 | 4/2015 |
| JP | 6407196 B2 | 10/2018 |

*Primary Examiner* — Victor A Mandala
*Assistant Examiner* — Colleen E Snow
(74) *Attorney, Agent, or Firm* — Allen & Overy LLP

(57) ABSTRACT

According to one embodiment, a method for manufacturing a semiconductor member is disclosed. The method can include measuring a first mass of a semiconductor substrate including a first semiconductor layer of a first conductivity type. The method can include forming a first opening in an upper surface of the first semiconductor layer. The method can include measuring a second mass of the semiconductor substrate in which the first opening is formed. In addition, the method can include when forming a second semiconductor layer of a second conductivity type in the first opening, changing an impurity concentration of the second conductivity type in the second semiconductor layer according to a difference in mass between the first mass and the second mass.

6 Claims, 7 Drawing Sheets

METHOD FOR MANUFACTURING SEMICONDUCTOR MEMBER AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2020-157540, filed on Sep. 18, 2020; the entire contents of which are incorporated herein by reference.

FIELD

Embodiments described herein relate generally to a method for manufacturing a semiconductor member and a method for manufacturing a semiconductor device.

BACKGROUND

A semiconductor device such as a metal-oxide-semiconductor field-effect transistor (MOSFET) is used in electric power conversion and the like. Semiconductor devices have been developed with a super-junction structure in which a plurality of first conductivity type semiconductor regions and a plurality of second conductivity type semiconductor regions are alternately arranged. Such semiconductor devices desirably have a small different in the amount of impurity between the amount of impurity in the first conductivity type semiconductor regions and the amount of impurity in the second conductivity type semiconductor regions.

DETAILED DESCRIPTION

Figure 1:
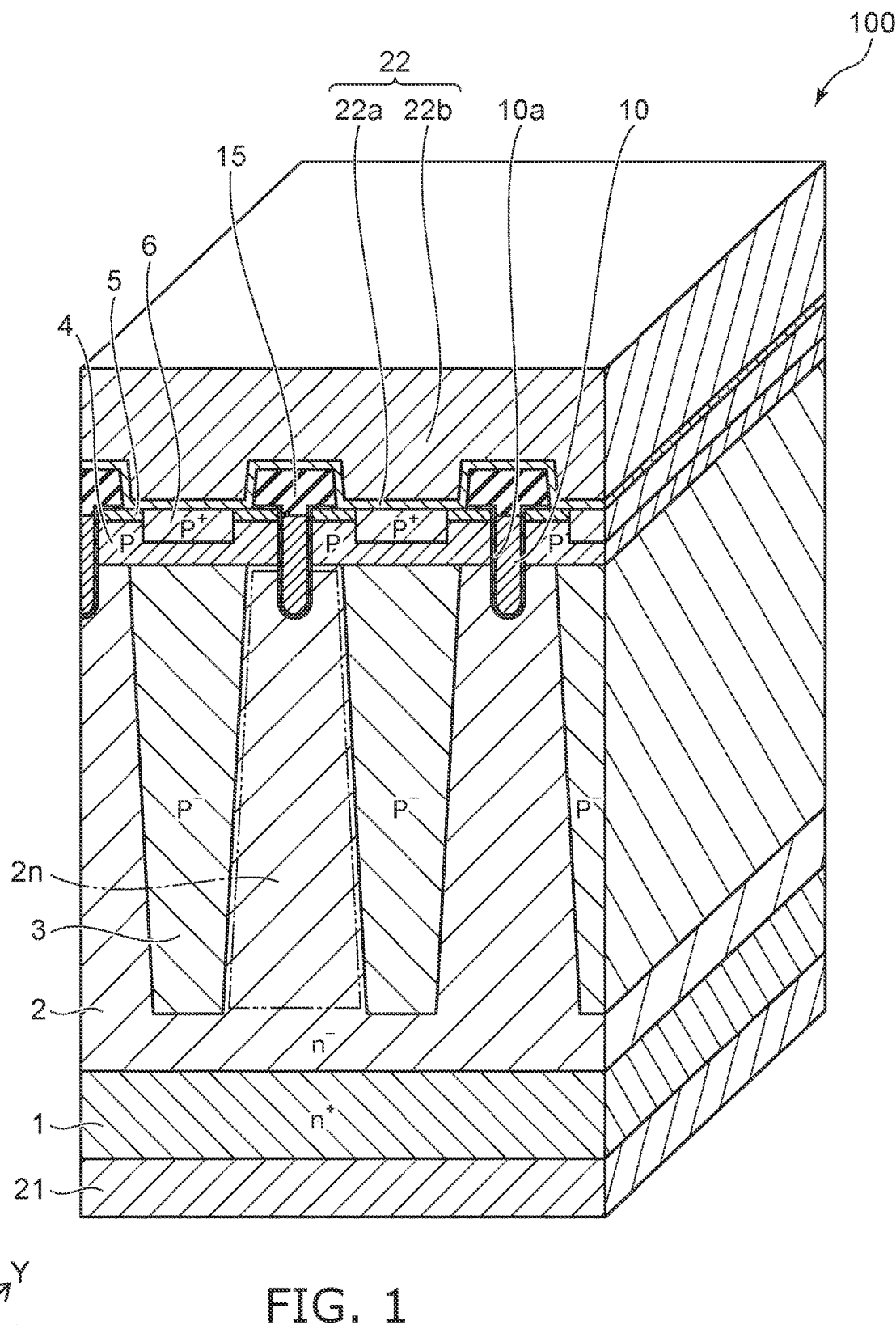
FIG. 1 is a cross-sectional view illustrating a semiconductor device with a super-junction structure manufactured by manufacturing method according to an embodiment.

According to one embodiment, a method for manufacturing a semiconductor member is disclosed. The method can include measuring a first mass of a semiconductor substrate including a first semiconductor layer of a first conductivity type. The method can include forming a first opening in an upper surface of the first semiconductor layer. The method can include measuring a second mass of the semiconductor substrate in which the first opening is formed. In addition, the method can include when forming a second semiconductor layer of a second conductivity type in the first opening, changing an impurity concentration of the second conductivity type in the second semiconductor layer according to a difference in mass between the first mass and the second mass.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$ and $p^+$, p represent relative high and low concentration of impurity. That is, the notation with "+" shows that the impurity concentration is relatively higher than the concentration of the notation without any of "+" and "−", and the notation with "−" shows that the impurity concentration is relatively lower than the concentration of the notation without any of them. These notations represent relative high and low concentration of net impurity after compensation of the impurity, when both of p-type impurity and n-type impurity are included in respective regions.

In the embodiments described later, the embodiments may be executed by inverting the p-type and the n-type in respective semiconductor regions.

FIG. 1 is a cross-sectional view illustrating a semiconductor device with a super-junction structure manufactured by manufacturing method according to an embodiment.

The semiconductor device 100 illustrated in FIG. 1 includes an $n^+$-type (first conductivity type) drain region 1, an $n^-$-type drift region 2, a $p^-$-type (second conductivity type) pillar region 3, a p-type base region 4, an $n^+$-type source region 5, a $p^+$-type contact region 6, a gate electrode 10, a drain electrode 21, and a source electrode 22.

The embodiments will be described using an XYZ orthogonal coordinate system. The direction from the drain electrode 21 toward the $n^+$-type drain region 1 is defined as the Z-direction (first direction), The directions perpendicular to the Z-direction and orthogonal to one another are defined as the X-direction (second direction) and the Y-direction (third direction). Also, in the description, the direction from the drain electrode 21 toward the $n^+$-type drain region 1 is referred to as "up", and the opposite direction is referred to as "down". These directions are based on the relative positional relationship between the drain electrode 21 and the $n^+$-type drain region 1 and have no connection to the direction of gravity.

The drain electrode 21 is provided at the lower surface of the semiconductor device 100. The $n^+$-type drain region 1 is provided on the drain electrode 21 and is electrically connected to the drain electrode 21, The $n^-$-type drift region 2 is provided on the $n^+$-type drain region 1. The $n^-$-type drift region 2 is electrically connected to the drain electrode 21 via the $n^+$-type drain region 1. The n-type impurity concentration in the $n^-$-type drift region 2 is lower than the n-type impurity concentration in the $n^+$-type drain region 1.

The $p^-$-type pillar region 3 is provided on the $n^-$-type drift region 2. The $n^-$-type drift region 2 includes an $n^-$-type pillar region 2n arranged side by side the p⁻-type pillar region 3 in the X-direction. The p-type base region 4 is provided on the p⁻-type pillar region 3. The p-type impurity concentration in the p-type base region 4 is higher than the p-type impurity concentration in the p⁻-type pillar region 3, The n⁺-type source region 5 and the p⁺-type contact region 6 are provided on the p-type base region 4, The p-type impurity concentration in the p⁺-type contact region 6 is higher than the p-type impurity concentration in the p-type base region 4.

The gate electrode 10 is provided on the n⁻-type pillar region 2n. The gate electrode 10 has an interface in the X-direction, via a gate insulating layer 10a, with a portion of the n⁻-type pillar region 2n, the p-type base region 4, and the n⁻-type source region 5.

The source electrode 22 is provided on the n⁺-type source region 5, the p⁺-type contact region 6, and the gate electrode 10 and is electrically connected to the n⁺-type source region 5 and the p⁺-type contact region 6. An insulating layer 15 is provided between the gate electrode 10 and the source electrode 22, The gate electrode 10 is electrically separate from the source electrode 22 with the insulating layer 15.

The source electrode 22 includes a first metal layer 22a and a second metal layer 22b, for example. The first metal layer 22a is provided along the upper surface of the n⁺-type source region 5, the upper surface of the p⁺-type contact region 6, and the front surface of the insulating layer 15. The second metal layer 22b is provided on the first metal layer 22a.

A plurality of the n⁻-type pillar regions 2n, a plurality of the p⁻-type pillar regions 3, a plurality of the p-type base regions 4, a plurality of the n⁺-type source regions 5, a plurality of the p⁺-type contact regions 6, and a plurality of the gate electrodes 10 are provided in the X-direction. The plurality of n⁻-type pillar regions 2n and the plurality of p⁻-type pillar regions 3 are alternately provided in the X-direction. The plurality of n⁻-type pillar regions 2n and the plurality of p⁻-type pillar regions 3 form a super-junction structure. Each n⁻-type pillar region 2n, each p⁻-type pillar region 3, each p-type base region 4, each n⁺-type source region 5, each p⁺-type contact region 6, and each gate electrode 10 extends in the Y-direction. Another p-type semiconductor region may be provided around the plurality of the p-type base regions 4 and the plurality of the gate electrodes 10. The plurality of p-type base regions 4 may be electrically connected with each other via the other p-type semiconductor region.

The operation of the semiconductor device 100 will now be described.

With voltage that is positive with respect to the source electrode 22 is applied to the drain electrode 21, a voltage greater than a threshold is applied to the gate electrode 10. A channel (inversion layer) is formed in the p-type base region 4. Electrons flow to the drain electrode 21 through the channel and the n⁻-type drift region 2. This puts the semiconductor device 100 in the on state. Thereafter, when the voltage applied to the gate electrode 10 is less than the threshold, the channel in the p-type base region 4 disappears, and the semiconductor device 100 is put in the off state.

When the semiconductor device 100 is in the off state and an electric potential positive with respect to the electric potential of the source electrode 22 is applied to the drain electrode 21, a depletion layer extends in the Z-direction from the p-n junction of the n⁻-type pillar region 2n and the p-type base region 4. Also, a depletion layer extends in the X-direction from the p-n junction of the n⁻-type pillar region 2n and the p⁻-type pillar region 3, The breakdown voltage of the semiconductor device 100 can be increased by the depletion layer of the n⁻-type pillar region 2n and the p⁻-type pillar region 3 extending in the X-direction. Also, the breakdown voltage of the semiconductor device 100 can be maintained, the n-type impurity concentration in the n⁻-type drift region 2 can be increased, and the on-resistance of the semiconductor device 100 can be reduced.

Examples of the materials of the components of the semiconductor device 100 will now be described.

The n⁺-type drain region 1, the n⁻-type drift region 2, the p⁻-type pillar region 3, the p-type base region 4, the n⁺-type source region 5, and the p⁺-type contact region 6 include as semiconductor material at least one selected from the group consisting of silicon, silicon carbide, and gallium nitride. In a case where silicon is used as the semiconductor material, arsenic, phosphorus, or antimony can be used as the n-type impurity. Boron can be used as the p-type impurity.

The gate electrode 10 includes a conductive material such as polysilicon. The gate insulating layer 10a and the insulating layer 15 include an insulating material such as silicon oxide. The drain electrode 21 and the second metal layer 22b include a metal, such as copper or aluminum. The first metal layer 22a includes a metal that functions as a barrier metal, such as titanium, titanium nitride, and tungsten.

The method for manufacturing a semiconductor member according to the embodiment will now be described.

FIGS. 2A, 2B, 3A, and 3B are cross-sectional views illustrating the method for manufacturing the semiconductor member according to the embodiment.

Figure 2A:
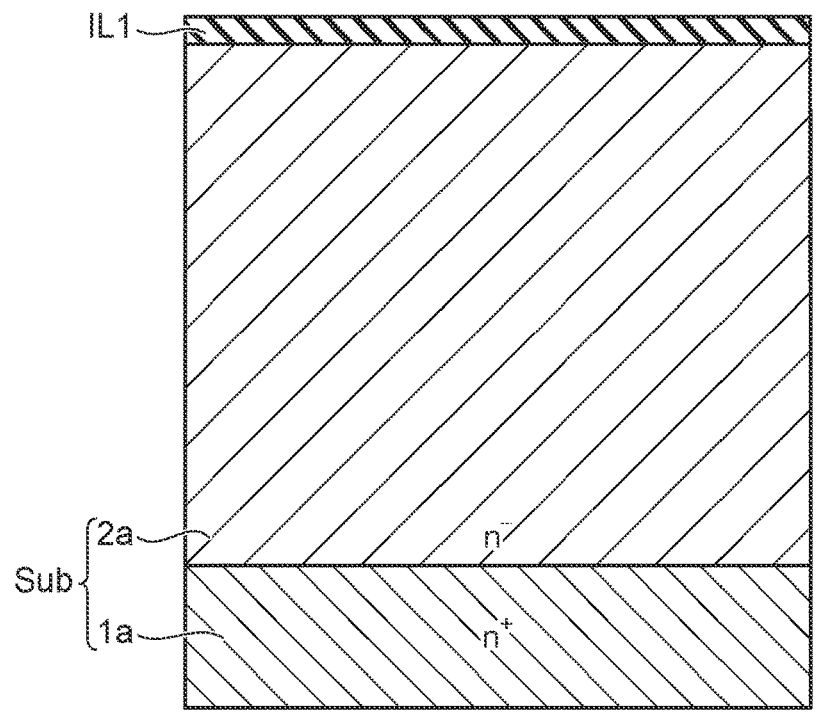
FIGS. 2A and 2B are cross-sectional views illustrating a method for manufacturing a semiconductor member according to the embodiment.

A semiconductor substrate Sub that includes an n⁺-type semiconductor layer 1a and an n⁻-type semiconductor layer 2a (first semiconductor layer) is prepared. The n⁻-type semiconductor layer 2a is provided on the n⁺-type semiconductor layer 1a. The semiconductor substrate Sub may not include the n⁺-type semiconductor layer 1a and only include the n⁻-type semiconductor layer 2a. The direction from the n⁺-type semiconductor layer 1a toward the n⁻-type semiconductor layer 2a is parallel with the Z-direction. The upper surface of the n⁻-type semiconductor layer 2a is parallel with the X-direction and the Y-direction. As illustrated in FIG. 2A, an insulating layer IL1 (first layer) is formed on the upper surface of the n⁻-type semiconductor layer 2a by thermal oxidation or chemical vapor deposition (CVD) of the semiconductor substrate Sub.

Figure 2B:
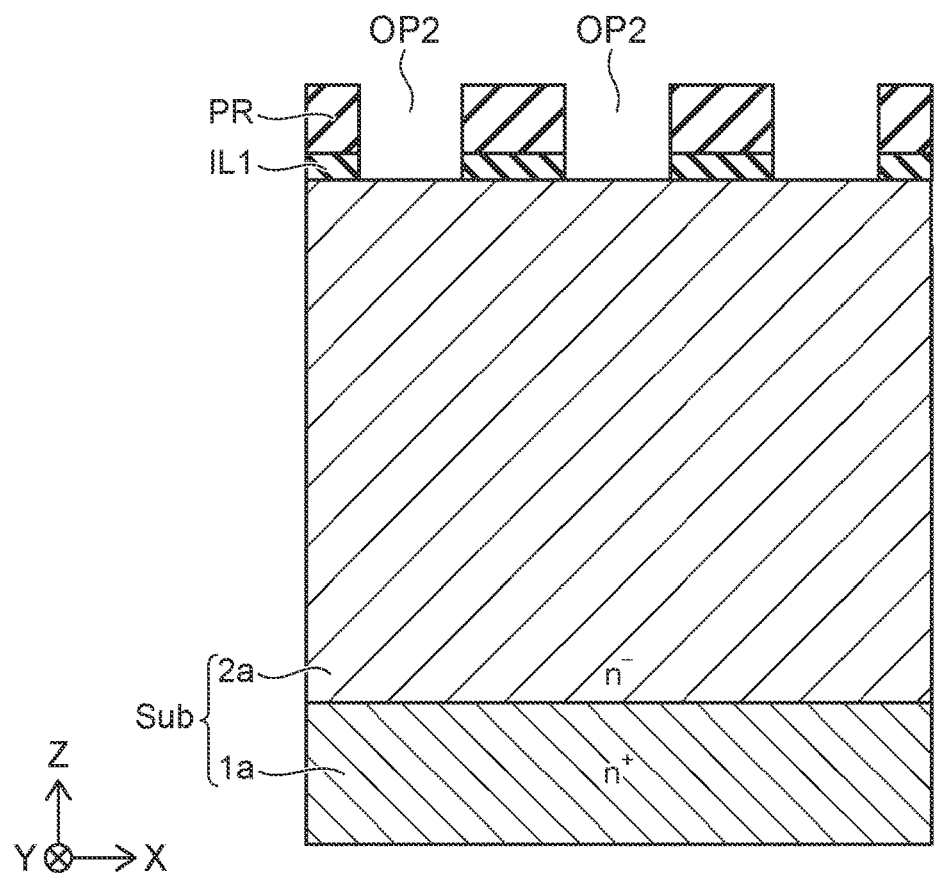

The mass (first mass) of the semiconductor substrate Sub with the insulating layer IL1 formed thereon is measured. The mass can, for example, be measured using a product of the Metryx series of the Lam Research Corporation or an electronic balance set in an environment with controlled temperature and atmospheric pressure. A photoresist PR is formed on the insulating layer IL1. The insulating layer IL1 is patterned by photo lithography and reactive-ion etching (RIE). In this manner, as illustrated in FIG. 2B, the insulating layer IL1 including an opening OP2 (second opening) is provided on the upper surface of the n⁻-type semiconductor layer 2a. A plurality of the openings OP2 are formed in the X-direction. Each opening OP2 extends in the Y-direction.

Figure 3A:
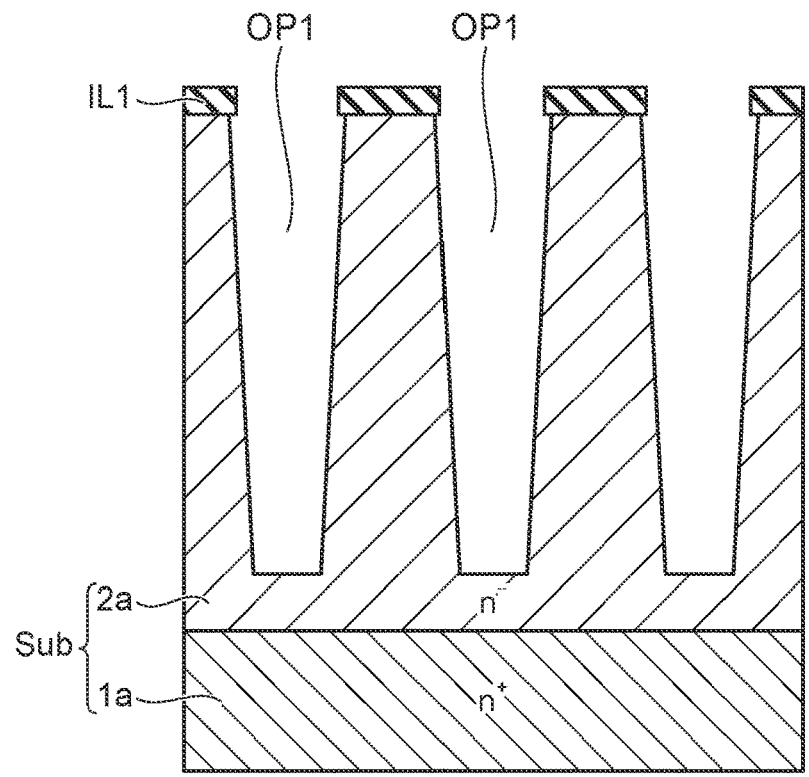
FIGS. 3A and 3B are cross-sectional views illustrating a method for manufacturing a semiconductor member according to the embodiment.

The photoresist PR is removed by ashing. The length of the opening OP2 in the X-direction is measured. The length is measured using a length measuring SEM (critical dimension scanning electron microscope CD-SEM). An opening OP1 (first opening) is formed on the upper surface of the n⁻-type semiconductor layer 2a by RIE using the insulating layer IL1 as a mask. The opening OP1 is formed at a position corresponding to the position of the opening OP2, As illustrated in FIG. 3A, a plurality of the openings OP1 are formed in the X-direction. Each opening OP1 extends in the Y-direction.

Figure 3B:
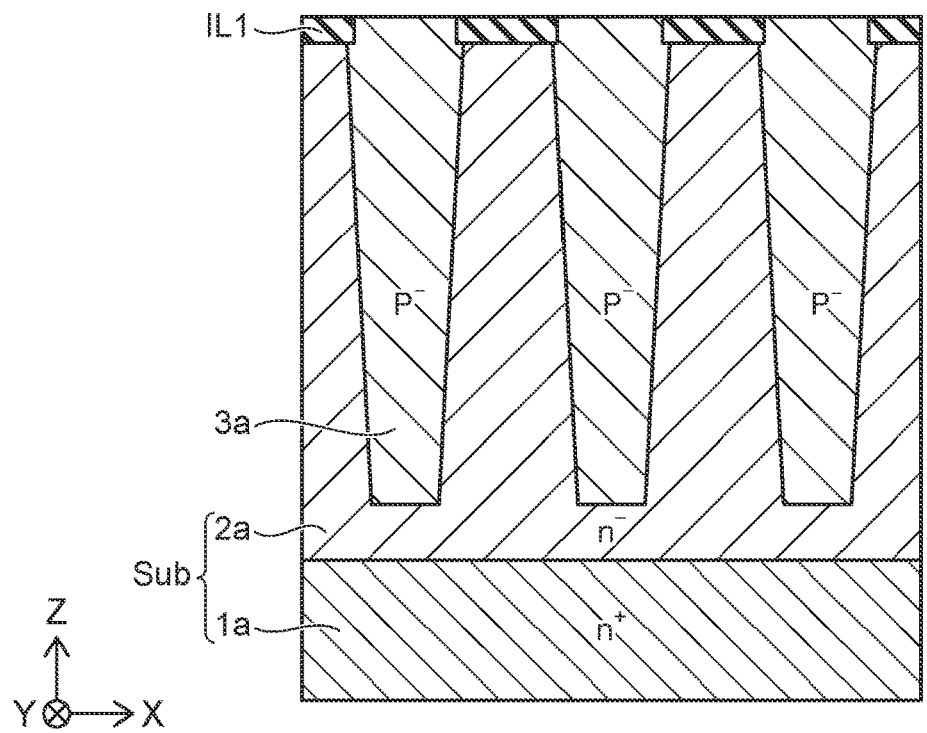

The mass (second mass) of the semiconductor substrate Sub with the opening OP1 formed thereon is measured. The second mass includes the mass of the insulating layer IL1. As illustrated in FIG. 3B, in the opening OP1, a p$^-$-type semiconductor layer 3a (second semiconductor layer) is epitaxially grown.

In the epitaxial growth, while heating the semiconductor substrate Sub, a first gas including silicon and a second gas including p-type impurity is supplied to the processing space where the semiconductor substrate Sub is placed. For example, a silane, chlorosilane, dichlorosilane, or trichlorosilane gas may be used as the first gas. For example, a diborane, triborane, or chloroborane gas may be used as the second gas. An etching gas may also be supplied to help prevent silicon deposits on the insulating layer IL1. A hydrochloric acid gas may be used as the etching gas.

When forming the p$^-$-type semiconductor layer 3a, the p-type impurity concentration in the p$^-$-type semiconductor layer 3a is changed according to the difference in mass between the first mass and the second mass. Specifically, as the mass difference is greater, the p-type impurity concentration in the p$^-$-type semiconductor layer 3a is made lower.

The following methods are examples of methods for changing the p-type impurity concentration in the p$^-$-type semiconductor layer 3a.

In a first method, when forming the p$^-$-type semiconductor layer 3a, the flow rate of the second gas is adjusted. As the mass difference is greater, the flow rate of the second gas is made lower. Instead of flow rate, pressure may be adjusted. For example, as the mass difference is greater, the pressure of the second gas in the space where the p$^-$-type semiconductor layer 3a is formed is made lower. As the flow rate is greater or as the pressure is higher, the amount of p-type impurity supplied to the semiconductor layer to be formed is increased. In this manner, the p-type impurity concentration in the p$^-$-type semiconductor layer 3a can be changed.

In a second method, first, an impurity layer including p-type impurity is formed along the inner wall of the opening OP1. Next, an undoped or low p-type impurity concentration semiconductor layer is formed inside the opening OP1. Then, the p$^-$-type semiconductor layer 3a is formed by diffusion of the p-type impurity toward the undoped or low p-type impurity concentration semiconductor layer from the impurity layer by heat treatment. When forming the impurity layer, by adjusting the flow rate of the second gas according to the mass difference, the p-type impurity concentration in the p$^-$-type semiconductor layer 3a can be changed.

Instead of adjusting the flow rate or pressure of the second gas, the flow rate or pressure of a dilution gas or an etching gas may be adjusted. A hydrogen gas may be used as a dilution gas.

Also, in addition to adjusting the flow rate or pressure of the second gas, the flow rate or pressure of a dilution gas or an etching gas may also be adjusted.

FIGS. 4A to 6 are cross-sectional views illustrating a method for manufacturing a semiconductor device according to the embodiment.

Figure 4A:
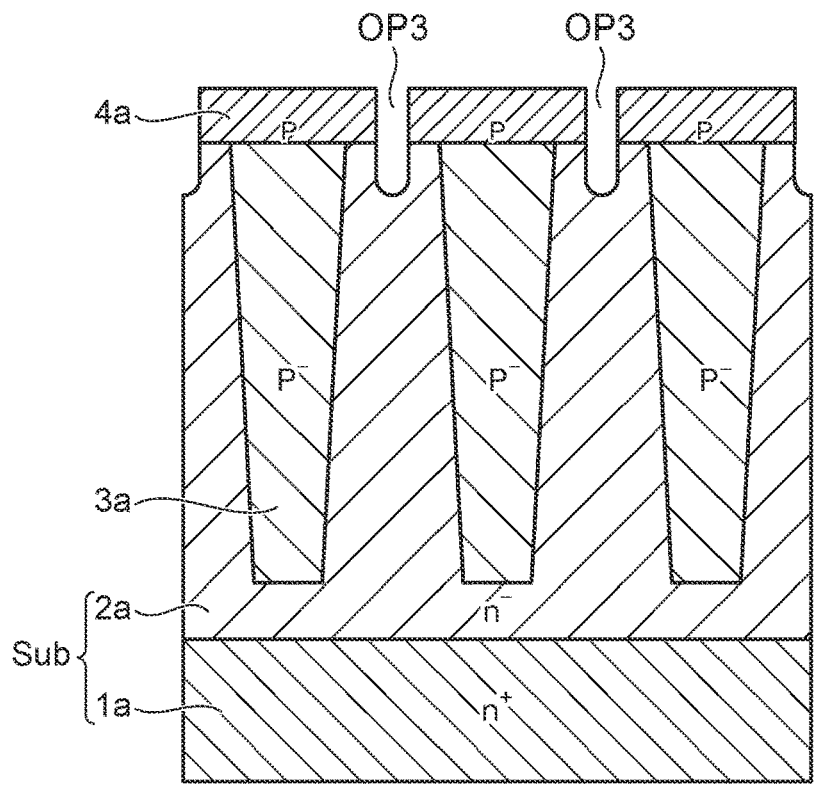
FIGS. 4A and 4B are cross-sectional views illustrating a method for manufacturing the semiconductor device according to the embodiment.

First, a semiconductor member including the n$^-$-type semiconductor layer 2a and the p$^-$-type semiconductor layer 3a is manufactured by the method for manufacturing a semiconductor member described above. The insulating layer IL1 is removed. Using chemical-mechanical polishing (CMP), the upper surface of the n$^-$-type semiconductor layer 2a and the p$^-$-type semiconductor layer 3a is flattened. The p-type impurity is ion-implanted on the upper surface of the n$^-$-type semiconductor layer 2a and the upper surface of the p$^-$-type semiconductor layer 3a, and a p-type semiconductor region 4a (first semiconductor region) is formed. As illustrated in FIG. 4A, an opening OP3 is formed on the n$^-$-type semiconductor layer 2a using photolithography and RIE. The opening OP3 extends through the p-type semiconductor region 4a and reaches the n$^-$-type semiconductor layer 2a. A plurality of the openings OP3 are formed in the X-direction, Each opening OP3 extends in the Y-direction.

Figure 4B:
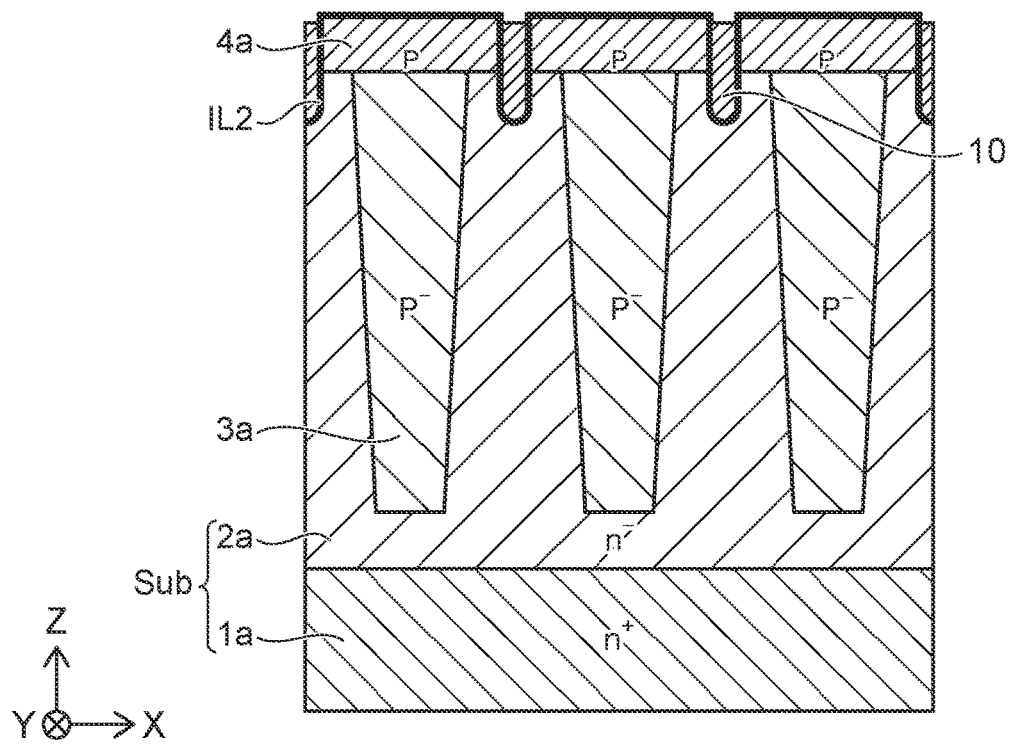

An insulating layer IL2 is formed along the inner wall of the opening OP3 and the upper surface of the p-type semiconductor region 4a by thermal oxidation, Using CVD, a conductive layer that fills the opening OP3 is formed on the insulating layer IL2. The upper surface of the conductive layer is retracted by chemical dry etching (CDE), RIE, or wet etching. In this manner, as illustrated in FIG. 4B, the gate electrode 10 is formed in the opening OP3.

Figure 5A:
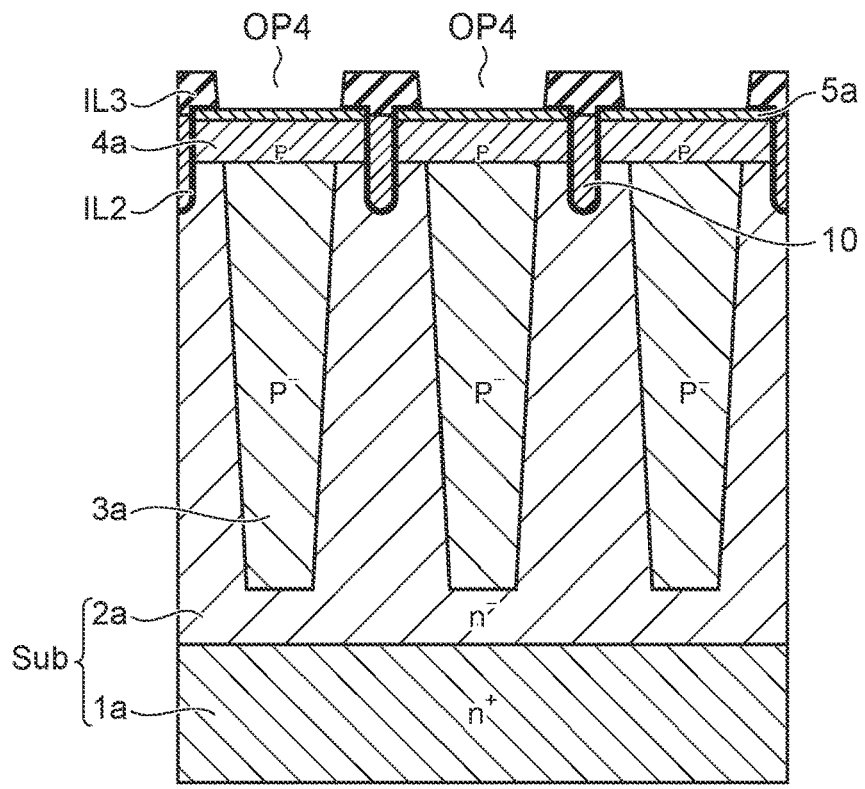
FIGS. 5A and 5B are cross-sectional views illustrating a method for manufacturing the semiconductor device according to the embodiment.

The n-type impurity is ion-implanted on the upper surface of the p-type semiconductor region 4a, and an n$^+$-type semiconductor region 5a (second semiconductor region) is formed. Using CVD, an insulating layer IL3 is formed on the n$^+$-type semiconductor region 5a and the gate electrode 10, Using photolithography and RIE, a portion of the insulating layer IL2 and a portion of the insulating layer IL3 are removed, and, as illustrated in FIG. 5A, an opening OP4 is formed. A portion of the n$^+$-type semiconductor region 5a is exposed via the opening OP4.

Figure 5B:
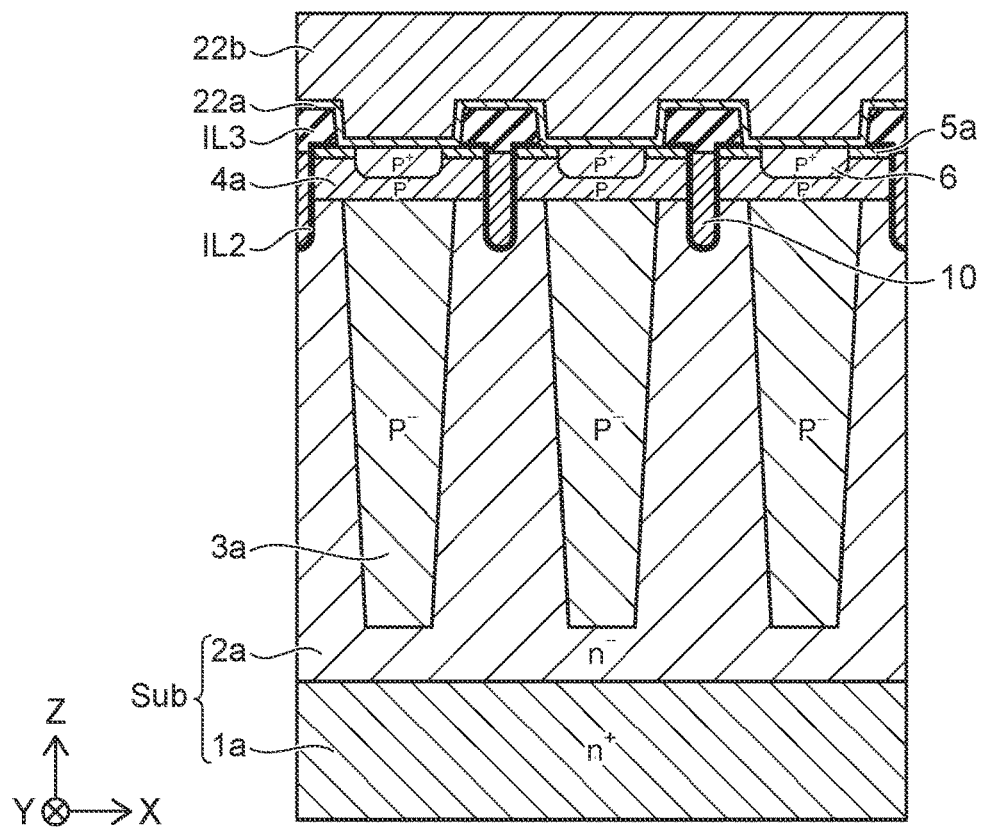

The p-type impurity is ion-implanted on the portion of the n$^+$-type semiconductor region 5a through the opening OP4, and the p$^+$-type contact region 6 is formed. Using sputtering, the first metal layer 22a is formed on the upper surface of the n$^+$-type semiconductor region 5a, the upper surface of the p$^+$-type contact region 6, and the front surface of the insulating layer IL3. As illustrated in FIG. 5B, using sputtering, the second metal layer 22b is formed on the first metal layer 22a. The source electrode 22 (first electrode) including the first metal layer 22a and the second metal layer 22b is formed.

Figure 6:
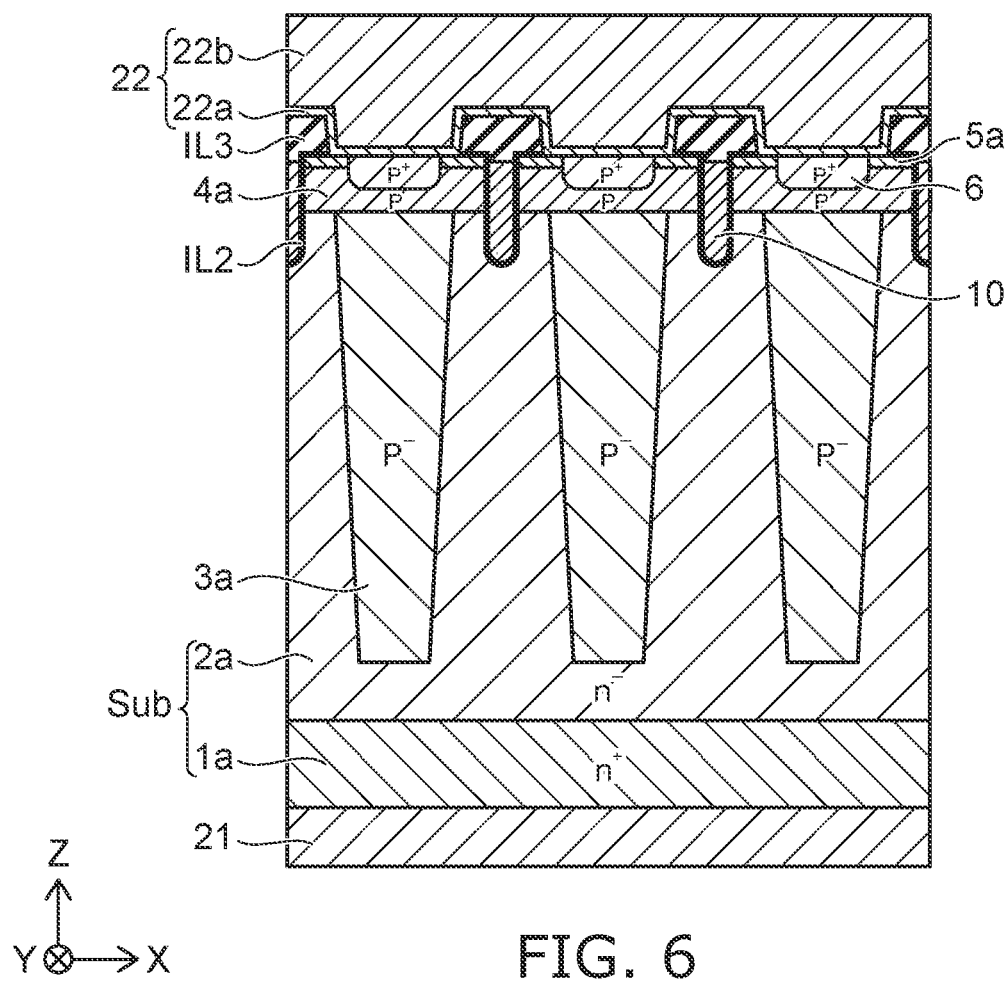
FIG. 6 is a cross-sectional view illustrating a method for manufacturing the semiconductor device according to the embodiment.

The lower surface of the n$^+$-type semiconductor layer 1a is ground down until the n$^+$-type semiconductor layer 1a is a predetermined thickness. Using sputtering, as illustrated in FIG. 6, the drain electrode 21 (second electrode) is formed on the lower surface of the n$^+$-type semiconductor layer 1a. In a case where the semiconductor substrate Sub used does not include the n$^+$-type semiconductor layer 1a, the lower surface of the n$^-$-type semiconductor layer 2a is ground down. The n-type impurity is ion-implanted on the ground lower surface, and an n$^+$-type semiconductor region is formed. Then, the drain electrode 21 is formed using sputtering. In this manner, the semiconductor device 100 according to the embodiment is manufactured.

As illustrated in the structure in FIG. 6, the n$^+$-type semiconductor layer 1a corresponds to the n$^+$-type drain region 1 of the semiconductor device 100. The n$^-$-type semiconductor layer 2a corresponds to the n$^-$-type drift region 2. The p$^-$-type semiconductor layer 3a corresponds to the p$^-$-type pillar region 3. The p-type semiconductor region 4a corresponds to the p-type base region 4. The n$^+$-type semiconductor region 5a corresponds to the n$^+$-type source region 5. The insulating layer IL2 corresponds to the gate insulating layer 10a. The insulating layer IL3 corresponds to the insulating layer 15.

The order of the processes in the manufacturing method described above may be changed as appropriate. For example, the p-type semiconductor region 4a may be formed after the gate electrode 10 is formed. The p$^+$-type contact region 6 may be formed after the n$^+$-type semiconductor region 5a is formed and before the insulating layer IL3 is formed. Also, other processes may be added as appropriate to the manufacturing method described above. For example, an insulating layer, such as a silicon nitride layer or a polyimide resin layer may be formed on a portion of the second metal layer 22b as a passivation layer. Another semiconductor region may be formed on the n$^-$-type semiconductor layer 2a.

The effects of the embodiment will now be described.

As described above, when the semiconductor device 100 is in the off state, a depletion layer extends in the X-direction from the p-n junction of the n$^-$-type pillar region 2n and the p$^-$-type pillar region 3. By the n$^-$-type pillar region 2n and the p$^-$-type pillar region 3 being depleted, the breakdown voltage of the semiconductor device 100 is increased. To promote depletion of the n$^-$-type pillar region 2n and the p$^-$-type pillar region 3, the difference in the amount of impurity between the amount of n-type impurity included in the n$^-$-type pillar region 2n and the amount of p-type impurity included in the p$^-$-type pillar region 3 is preferably small. The width (length in the X-direction) of the n$^-$-type pillar region 2n, the n-type impurity concentration in the n$^-$-type pillar region 2n, the width of the p$^-$-type pillar region 3, and the p-type impurity concentration in the p$^-$-type pillar region 3 are set in a manner so that the difference is reduced.

The amount of n-type impurity of the n$^-$-type pillar region 2n and the amount of p-type impurity of the p$^-$-type pillar region 3 change according to the size of the opening OP1 illustrated in FIG. 3A. For example, as the cross-sectional area of the opening OP1 is greater, the cross-sectional area of the p$^-$-type semiconductor layer 3a is greater, leading to the cross-sectional area of the n$^-$-type semiconductor layer 2a between two openings OP1 being small. As a result, the amount of n-type impurity of the n$^-$-type pillar region 2n is reduced, and the amount of p-type impurity of the p$^-$-type pillar region 3 is increased. The more the cross-sectional area of the opening OP1 shifts from the design value, the greater the difference in the amount of impurity between the amount of n-type impurity of the n$^-$-type pillar region 2n and the amount of p-type impurity of the p$^-$-type pillar region 3 is.

In the manufacturing method according to the embodiment, the first mass of the semiconductor substrate Sub when no openings OP1 are formed and the second mass of the semiconductor substrate Sub after the opening OP1 is formed are measured. The magnitude of the difference in mass between the first mass and the second mass correlates to the cross-sectional area of the opening OP1. As the cross-sectional area of the opening OP1 is greater, the difference in mass is greater. By changing the p-type impurity concentration in the p-type semiconductor layer 3a according to the difference in mass, the difference in the amount of impurity can be reduced.

The difference in mass (first nominal value) when the amount of n-type impurity of the n$^-$-type pillar region 2n and the amount of p-type impurity of the p$^-$-type pillar region 3 are equal is preset. When forming the p$^-$-type semiconductor layer 3a, so that the amount of n-type impurity of the n$^-$-type pillar region 2n and the amount of p-type impurity of the p$^-$-type pillar region 3 are equal, the flow rate (nominal flow rate) of the second gas is preset. When the first mass and the second mass are measured, the difference in mass is calculated. The change amount (first change amount) in the difference in mass based on the measurement result with respect to the first nominal value is calculated. The flow rate of the second gas is changed from the nominal flow rate according to the first change amount. As the difference in mass based on the measurement result is greater than the first nominal value, the flow rate of the second gas is made less than the nominal flow rate. As the difference in mass based on the measurement result is less than the first nominal value, the flow rate of the second gas is made greater than the nominal flow rate.

For example, data indicative of the relationship between the first change amount and a flow rate correction amount is preset. When the first change amount is calculated, the data is referenced, and a correction amount corresponding to the first change amount is obtained. The nominal flow rate is corrected on the basis of the obtained correction amount. When forming the p$^-$-type semiconductor layer 3a, the second gas is supplied at the corrected flow rate.

According to the manufacturing method according to the embodiment, a semiconductor member with a reduced difference in the amount of impurity is manufactured. By using such a semiconductor member, a semiconductor device 100 capable of reducing the difference in the amount of impurity can be manufactured.

An example of the manufacturing method according to a comparative example includes a method of adjusting the p-type impurity concentration of the p$^-$-type semiconductor layer 3a on the basis of an analysis result of a manufactured semiconductor member or semiconductor device. Specifically, with a semiconductor member or semiconductor device, the width of the n$^-$-type pillar region 2n and the width of the p$^-$-type pillar region 3 is measured, and, on the basis of the measurement result, the p-type impurity concentration of the p$^-$-type semiconductor layer 3a is adjusted in the following manufacture process. In other words, in the manufacturing method according to the comparative example, the p-type impurity concentration of the p$^-$-type semiconductor layer 3a is controlled using feedback.

According to the manufacturing method according to the embodiment, the first change amount can be calculated before forming the p$^-$-type semiconductor layer 3a. The p-type impurity concentration of the p$^-$-type semiconductor layer 3a formed thereafter can be adjusted on the basis of the first change amount. In other words, the p-type impurity concentration of the p$^-$-type semiconductor layer 3a can be controlled using feedback on the basis of the first change amount. By the p-type impurity concentration of the p$^-$-type semiconductor layer 3a being controlled using feedback on the basis of the measurement result partway through the manufacturing process, the difference in the amount of impurity can be reduced more than in the manufacturing method according to the comparative example. Also, manufacturing semiconductor devices with poor characteristics can be minimized, and the yield of semiconductor members and semiconductor devices can be improved.

The p-type impurity concentration in the p$^-$-type semiconductor layer 3a may be changed according to the width of the opening OP2 in addition to the first change amount. The width of the opening OP2 correlates to the width of the opening OP1 formed using the insulating layer IL1 as a mask. As the width of the opening OP2 is wider, the width of the opening OP1 is also wider and the cross-sectional area of the opening OP1 is greater.

The width (second nominal value) of the opening OP2 is preset to a value preferable for making the amount of n-type impurity of the n$^-$-type pillar region 2n and the amount of p-type impurity of the p$^-$-type pillar region 3 equal. After the opening OP2 is formed, the width of the opening OP2 is measured. The change amount (second change amount) of the measured width with respect to the second nominal value is calculated. The flow rate of the second gas is changed from the nominal flow rate according to the first change amount and the second change amount.

For example, data indicative of the relationship between the first change amount, the second change amount, and a flow rate correction amount is preset. When the first change amount and the second change amount are calculated, the data is referenced, and a correction amount corresponding to the first change amount and the second change amount is obtained. The flow rate of the second gas is corrected from the nominal flow rate on the basis of the obtained correction amount. When forming the p$^-$-type semiconductor layer 3a, the second gas is supplied at the corrected flow rate.

The difference in mass depends on the width of the opening OP1 as well as the depth (length in the Z-direction) of the opening OP1. A difference in mass may result from variations in the depth of the openings OP1, When the opening OP1 is deeper, the length of the p$^-$-type pillar region 3 in the Z-direction is greater. Accordingly, the length in the Z-direction of the n$^-$-type pillar region 2n arranged side by side the p$^-$-type pillar region 3 is also greater, Thus, variations in the depth of the openings OP1 have little effect on the difference in the amount of impurity. By changing the p-type impurity concentration in the p-type semiconductor layer 3a according to the first change amount and the second change amount, the difference in the amount of impurity can be further reduced.

When forming the opening OP1, variations in the etching amount occur. When estimating the cross-sectional area of the opening OP1 on the basis of only the width of the opening OP2, variations in the etching amount cause accuracy to be reduced compared to when estimating on the basis of the difference in mass. Thus, when the p-type impurity concentration in the p$^-$-type semiconductor layer 3a is changed according to only the measurement result of the width of the opening OP2, the difference in the amount of impurity tends to be great compared to when the p-type impurity concentration in the p$^-$-type semiconductor layer 3a is changed according to only the difference in mass. Thus, the p-type impurity concentration in the p$^-$-type semiconductor layer 3a is preferably changed according to the width of the opening OP2 and the difference in mass.

Figure 7A:
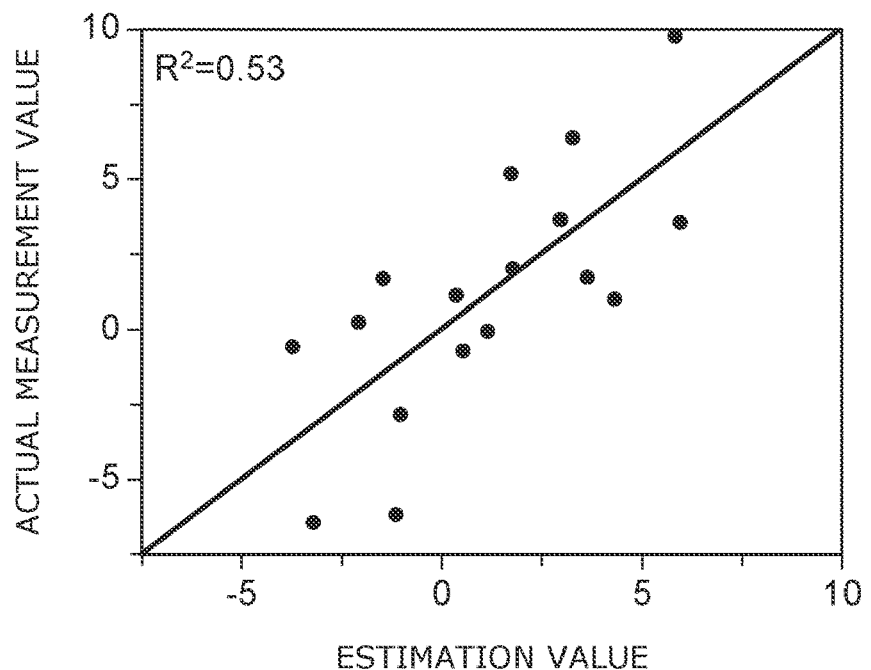
FIG. 7A is a graph illustrating the characteristics of a manufacturing method according to a reference example.
Figure 7B:
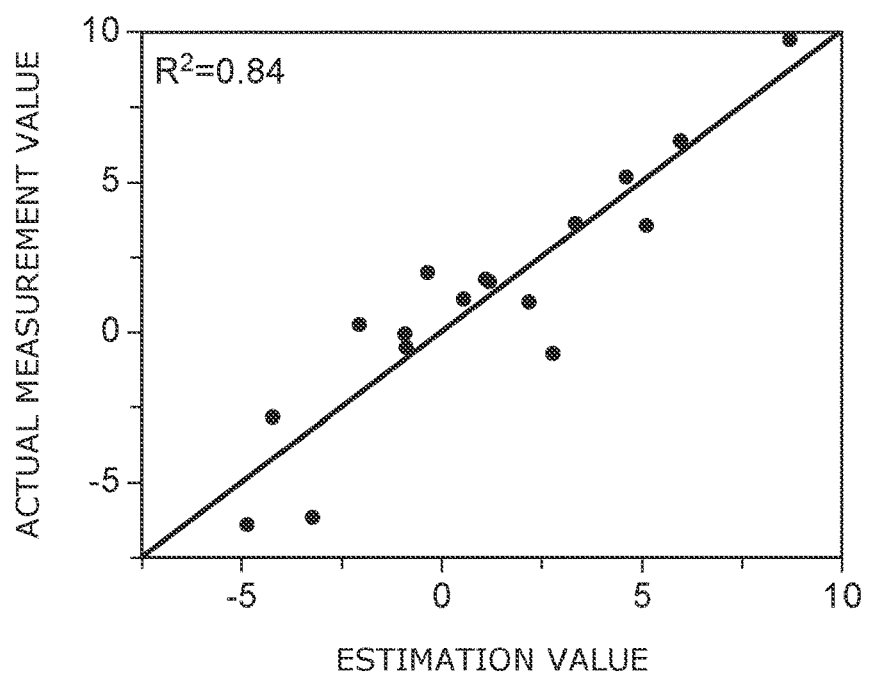
FIG. 7B is a graph illustrating the characteristics of the manufacturing method according to the embodiment

FIG. 7A is a graph illustrating the characteristics of the manufacturing method according to a reference example. FIG. 7B is a graph illustrating the characteristics of the manufacturing method according to the embodiment.

In the manufacturing method according to the embodiment, the first mass, the second mass, and the width of the opening OP2 are measured. In the manufacturing method according to the reference example, only the width of the opening OP2 is measured, and the first mass and the second mass are not measured.

The graph of FIG. 7A is obtained by the following process.

In the process of manufacturing a semiconductor device, the width of the opening OP2 is measured. The p$^-$-type semiconductor layer 3a is formed by supplying the second gas at the nominal flow rate. From the electrical characteristics of the manufactured semiconductor device, the ratio between the amount of n-type impurity included in the n$^-$-type semiconductor layer 2a and the amount of p-type impurity included in the p$^-$-type semiconductor layer 3a can be calculated. Specifically, for the manufactured semiconductor device, the breakdown voltage value when a voltage is not applied to the gate electrode 10 and the breakdown voltage value when a voltage is applied to the gate electrode 10 are measured, and the breakdown voltage ratio between the two is measured. A simulation result relating to the breakdown voltage ratio obtained in previous mass production data is referenced. From the simulation result, a ratio between the amount of n-type impurity included in the n$^-$-type semiconductor layer 2a and the amount of p-type impurity included in the p$^-$-type semiconductor layer 3a corresponding to the breakdown voltage ratio is obtained. This is taken as the actual measurement value. The actual measurement value can be represented as a percentage using a mathematical formula (Np/Nn−1), A plus symbol indicates a state in which the amount of p-type impurity is more than the amount of n-type impurity. *A minus* symbol indicates a state in which the amount of n-type impurity is more than the amount of p-type impurity.

The amount of p-type impurity in the p$^-$-type semiconductor layer 3a when the second gas is supplied at the nominal flow rate is estimated. An estimation value of the ratio of the amount of impurity is calculated on the basis of the estimation result. Specifically, the estimation value of the ratio of the amount of impurity is represented by (Np1/Nn1−1), Np1 is the amount of p-type impurity estimated to be in the p$^-$-type semiconductor layer 3a. Nn1 is the amount of n-type impurity in the n$^-$-type semiconductor layer 2a estimated in advance, Np1 is the product of the cross-sectional area of the opening OP1 and the p-type impurity concentration in the p$^-$-type semiconductor layer 3a. The cross-sectional area of the opening OP1 is the cross-sectional area estimated when the opening OP1 is formed via the opening OP2 including the estimated width. The p-type impurity concentration is the value when the second gas is supplied at the nominal flow rate. Nn1 is the product of the n-type impurity concentration in the n$^-$-type semiconductor layer 2a and the cross-sectional area of the n$^-$-type semiconductor layer 2a between two openings OP1. The n-type impurity concentration in the n$^-$-type semiconductor layer 2a is provided from the manufacturer that supplies the semiconductor substrate Sub. Also, the n-type impurity concentration in the n$^-$-type semiconductor layer 2a may be measured using a mercury probe or CV measurement before processing by the semiconductor manufacturing device. The cross-sectional area of the n$^-$-type semiconductor layer 2a between two openings OP1 is a value obtained by subtracting the estimated cross-sectional area of the opening OP1 from the product of the pitch of the gate electrodes 10 and the nominal value of the depth of the opening OP1.

The graph of FIG. 7B is obtained by a similar manner to the graph of FIG. 7A.

In the process of manufacturing a semiconductor device, the first mass, the second mass, and the width of the opening OP2 are measured. The p$^-$-type semiconductor layer 3a is formed by supplying the second gas at the nominal flow rate. From the electrical characteristics of the manufactured semiconductor device, the ratio between the amount of n-type impurity included in the n$^-$-type semiconductor layer 2a and the amount of p-type impurity included in the p$^-$-type semiconductor layer 3a can be calculated. This is taken as the actual measurement value.

The amount of n-type impurity in the n$^-$-type semiconductor layer 2a and the amount of p-type impurity in the p$^-$-type semiconductor layer 3a when the second gas is supplied at a flow rate corresponding to the first change amount and the second change amount are estimated. An estimation value of the ratio of the amount of impurity represented by (Np1/Nn1−1) is calculated.

In FIGS. 7A and 7B, the horizontal axis represents the estimation value of the ratio of the amount of impurity, and the vertical axis represents the actual measurement value of the ratio of the amount of impurity. The solid line represents a line where the estimation value and the actual measurement value match. As can be seen by comparing the results illustrated in FIGS. 7A and 7B, with the manufacturing method according to the embodiment, the actual measurement value varies less from the estimation value compared to the manufacturing method according to the reference example, Specifically, for the manufacturing method according to the reference example, a determination coefficient $R^2$ of the estimation value with respect to the actual measurement value is 0.53. For the manufacturing method according to the embodiment, the determination coefficient $R^2$ of the estimation value with respect to the actual measurement value is 0.84. When variation of the estimation value with respect to the actual measurement value is small, the difference in the amount of impurity can be reduced when the p-type impurity concentration of the p$^-$-type semiconductor layer 3a is controlled using feedback. Compared to the manufacturing method according to the reference example, the manufacturing method according to the embodiment can reduce the difference in the amount of impurity. This allows yield to be enhanced, for example.

Calculating the difference in mass, calculating the first change amount, calculating the second change amount, obtaining the correction amount, correcting the flow rate of the second gas, and the like are executed by a general-purpose or dedicated computer. Alternatively, the processing may be executed by a person.

Also, other processes may be added as appropriate to the manufacturing method according to the embodiment described above. For example, n-type semiconductor layer formation and the set of processes illustrated in FIGS. 2A to 3B may be executed a plurality of times, and regions corresponding to the n$^-$-type pillar region 2n and the p$^-$-type pillar region 3 may be formed. In this case also, the mass of the regions are measured after the insulating layer IL1 is formed and after the opening is formed to the n-type semiconductor layer, and the p-type impurity concentration in the p-type semiconductor layer is adjusted according to the difference in mass. In this manner; a semiconductor device 100 with a small difference in the amount of impurity is manufactured.

In the method for manufacturing according to the embodiment described above, a trench gate MOSFET with a super-junction structure is used as an example. However, the manufacturing method can be applied to the structure of a planar MOSFET or a field plate MOSFET.

In the manufacturing method according to the embodiment described above, the first mass is the mass of the semiconductor substrate Sub after the insulating layer IL is formed and before the opening OP1 is formed. The second mass is the mass of the semiconductor substrate Sub just after the opening OP1 is formed.

However, no such limitation is intended, and as long as it is before the opening OP1 is formed, the mass of the semiconductor substrate Sub at a discretionary timing can be used as the first mass. For example, the mass of the semiconductor substrate Sub before the opening OP1 is formed and after the opening OP2 is formed may be used as the first mass.

In a similar manner, as long as it is after the opening OP1 is formed, the mass of the semiconductor substrate Sub at a discretionary timing can be used as the second mass. For example, as long as the trench processing process is executed after the opening OP1 is formed, the mass measured after the trench processing process may be used as the second mass.

While certain embodiments have been described, these embodiments have been presented by way of example only, and are not intended to limit the scope of the inventions, Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A method for manufacturing a semiconductor member, comprising:
    measuring a first mass of a semiconductor substrate including a first semiconductor layer of a first conductivity type;
    forming a first opening in an upper surface of the first semiconductor layer;
    measuring a second mass of the semiconductor substrate in which the first opening is formed; and
    when forming a second semiconductor layer of a second conductivity type in the first opening, changing an impurity concentration of the second conductivity type in the second semiconductor layer according to a difference in mass between the first mass and the second mass.

2. The method according to claim 1, wherein
    in forming the first opening,
        a first layer including a second opening is formed on the upper surface, and the second opening is provided to correspond to a position where the first opening is formed,
        a length of the second opening in a first direction along the upper surface is measured,
        the first opening is formed using the first layer as a mask, and
    when forming the second semiconductor layer, the impurity concentration of the second conductivity type in the second semiconductor layer is further changed according to the length.

3. The method according to claim 1, wherein
    the second semiconductor layer is formed by supplying a first gas including semiconductor material and a second gas including impurity of the second conductivity type to the semiconductor substrate, and
    when forming the second semiconductor layer, the impurity concentration of the second conductivity type in the second semiconductor layer is changed by changing a flow rate or a pressure of the second gas according to the difference in mass.

4. The method according to claim 1, wherein
    a plurality of the first openings are formed in a first direction along the upper surface.

5. The method according to claim 1, wherein
    the first semiconductor layer and the second semiconductor layer include at least one selected from the group consisting of silicon, silicon carbide, and gallium nitride.

6. A method for manufacturing a semiconductor device, comprising:
    executing the method for manufacturing the semiconductor member according to claim 1;

forming a first semiconductor region of a second conductivity type on the upper surface of the first semiconductor layer and an upper surface of the second semiconductor layer;

forming a gate electrode on the first semiconductor layer;

forming a second semiconductor region of a first conductivity type on an upper surface of the first semiconductor region;

forming a first electrode electrically connected to the second semiconductor region on the second semiconductor region; and forming a second electrode electrically connected to the first semiconductor layer below the first semiconductor layer.

\* \* \* \* \*